(12) United States Patent
Kim et al.

(10) Patent No.: US 6,730,458 B1
(45) Date of Patent: May 4, 2004

(54) METHOD FOR FORMING FINE PATTERNS THROUGH EFFECTIVE GLASS TRANSITION TEMPERATURE REDUCTION

(75) Inventors: Hyunwoo Kim, Suwon (KR); Sanggyun Woo, Yongin (KR)

(73) Assignee: Samsung Electronics Co., Ltd., Kyongki-do (KR)

( * ) Notice: Subject to any disclaimer, the term of this patent is extended or adjusted under 35 U.S.C. 154(b) by 0 days.

(21) Appl. No.: 10/376,604

(22) Filed: Mar. 3, 2003

(51) Int. Cl.$^7$ .................................................. G03C 5/00
(52) U.S. Cl. ........................ 430/296; 430/311; 430/328; 430/330; 430/942
(58) Field of Search ................................ 430/296, 311, 430/328, 330, 942

(56) References Cited

U.S. PATENT DOCUMENTS

| | | | |
|---|---|---|---|
| 5,714,835 A | 2/1998 | Zachau et al. ............... | 313/486 |
| 6,015,759 A | 1/2000 | Khan et al. .................. | 438/707 |
| 6,277,767 B1 | 8/2001 | Shiramizu et al. ........... | 438/795 |
| 6,282,222 B1 | 8/2001 | Wieser et al. ................. | 372/74 |
| 6,339,028 B2 | 1/2002 | Tesauro ....................... | 438/708 |
| 6,369,398 B1 | 4/2002 | Gelernt .................... | 250/492.2 |

OTHER PUBLICATIONS

Lars W. Liebmann; "Resolution Enhancement Techniques in Optical Lithography, it's not Just a Mask Problem"; IBM Microelectronics Division.

*Primary Examiner*—Christopher G. Young
(74) *Attorney, Agent, or Firm*—Harness, Dickey & Pierce, P.L.C.

(57) ABSTRACT

A method for forming fine patterns, particularly contact holes, on semiconductor devices by forming an ArF resist pattern and then reducing the size of pattern openings by exposing the resist pattern to radiation from an VUV (vacuum ultraviolet) excimer laser or E-beam radiation during thermal treatment to reduce, temporarily, the $T_g$ of the resist pattern and allow it to flow, thereby reducing the size of the spaces and openings in the pattern.

21 Claims, 5 Drawing Sheets

CD Slimming = $CD_o - CD_t$

METHOD FOR FORMING FINE PATTERNS THROUGH EFFECTIVE GLASS TRANSITION TEMPERATURE REDUCTION

BACKGROUND OF THE INVENTION

1. Field of the Invention

The present invention relates to a method for forming fine patterns on semiconductor devices, and more particularly to reducing the size of pattern features through post-development processing.

2. Description of the Related Art

Demand for semiconductor devices having increasing processor speeds and memory devices having ever higher integration densities for use in a wide range of electronic devices has led to a corresponding demand for production of circuit features of sub micron sizing. Lithographic developments, such as improved photoresist compositions and improved dimensional accuracy of the resulting patterns, particularly for structures of minimum feature size, have been driven by these demands for increased integration density. The formation of highly accurate fine photoresist patterns which are widely used to mask etch and ion implantation processes is required for successfully manufacturing high density semiconductor devices. A sensitive photoresist is needed to define these features, but the use of sensitive photoresists presents additional process complications. It is anticipated that that ArF lithography may be utilized in the fabrication devices manufactured using a 0.13 μm process using a single layer resist, but that even greater accuracy and dimensional control will be needed for future sub-0.10 μm processes.

According to Rayleigh's equation $$R = k_1 \lambda / NA$$

wherein R denotes the ultimate resolution, $k_1$ is a constant, λ is the wavelength of the light source used during the exposure, and NA is the numerical aperture of the illuminating optical system, decreasing the wavelength of the exposing light source will tend to enhance the ultimate resolution. This principle has been applied during the transition of photolithographic processes from g-line (436 nm) to i-line (365 nm) exposing light sources and more recently to projection exposure equipment using KrF excimer lasers (248 nm) as the exposing light source. This trend toward ever smaller wavelengths is leading to development of projection exposure equipment and processes that may utilize an ArF excimer laser (having a central wavelength of 193 nm) or an $F_2$ excimer laser (having a central wavelength of 157 nm) as the exposing light source.

The wavelength of the exposing light source directly impacts the minimum resolution that may be obtained on any piece of exposure equipment. For instance, in the creation of fine line and space (L/S) patterns, the resolution limit of g-line exposure equipment is approximately 0.5 μm and the resolution limit for i-line exposure equipment is approximately 0.3 μm. More recent device design rules, however, are tending toward L/S measurements of less than about 0.2 μm. In order to transfer such patterns from projection masks onto wafers with sufficient accuracy, KrF and ArF excimer lasers have been utilized as the exposure light sources.

It is anticipated that the minimum feature sizes allowed by future device design rules will continue to decrease. Candidates for exposure apparatus capable of manufacturing devices built to such design rules include $F_2$ excimer laser, X-ray and electron beam (EB or E-beam) exposure apparatus. In particular, as device design rules allow for smaller and smaller minimum features, it becomes more difficult to provide sufficient process margins for the formation of contact and via holes than for the formation of L/S structures having similar sizing. This is particularly true for high-density devices that require the formation of small contact holes with high aspect ratios in the cell array region of the device.

Various techniques have been developed to address the difficulties inherent in forming small, high-aspect ratio contact holes including, for instance, thermal flow and the RELACS (Resolution Enhancement Lithography Assisted by Chemical Shrink) processes. The thermal flow process forms a fine pattern by forming an initial contact hole photoresist pattern with contact holes sized larger than the desired final contact hole size, and then heating the photoresist pattern to a temperature above the glass transition temperature ($T_g$) of the photoresist. This heating reduces the viscosity of the polymerized photoresist and allows it to flow or slump, thereby reducing the size of the contact openings to achieve the desired contact hole sizing.

Although thermal flow processes may be useful in photolithographic processes utilizing i-line or KrF resists, in the case of ArF resists the $T_g$ (a minimum of approximately 200° C.) is generally higher than their decomposition temperature ($T_d$), typically not more than approximately 180° C. Therefore, the thermal flow process cannot be used with ArF resists because the resist pattern will begin to decompose before it flows.

The RELACS process forms a fine pattern by again forming a normal contact hole photoresist pattern with contact openings sized larger than the desired final contact hole size. This initial photoresist pattern is then coated with a water-soluble polymer that reacts to form an insoluble cross-linked layer along the surface of photoresist pattern. The unreacted polymer is then removed by rinsing the photoresist pattern. The cross-linked layer increases the effective size of the photoresist pattern, thereby reducing the size of contact openings or the spaces in L/S structures. RELACS processes utilizing a single step for removing the water-soluble polymer, however, may be subject to problems of incomplete removal resulting in development residues, such as specks or films, in the pattern. During subsequent etch processes, such development residues increase the chance of defects in the final device, depressing yield and reliability. A two-step cleansing process in which the wafer is cleaned with a first solution and is then rinsed with water may decrease the amount of development residue left on the wafer, but also tends to complicate the process and increases the expense.

Resist compositions suitable for use with ArF excimer laser exposing light sources (ArF resist) such as poly(meth) acrylate, cyclo-olefin maleic anhydride (COMA) and polynorbornene, are susceptible to problems with critical dimension (CD) line shrinkage during SEM measurement (also referred to as CD slimming) as shown in FIG. 1. ArF resists also suffer from weak dry-etch resistance, Line Edge Roughness (LER) and CD slimming. LER and CD slimming in particular remain significant issues in processes utilizing ArF resists. During CD-SEM measurement, the electron bombardment of the fine resist features during measurement can actually permanently reduce the feature size. If the same resist feature is re-measured, the feature size will continue to shrink. An example of how the measured CD decreases during repeated measurements is shown in FIG. 2.

The differences in composition between KrF resists and ArF resists may produce significant differences in the performance of the materials. For example, KrF resists are more resistant to CD slimming (<2%) during CD-SEM measurement while ArF resists exhibit CD slimming of 6% to 15% during SEM measurement. These results suggest that CD slimming could be a widespread problem with ArF resists. Generally, the CD of the patterned lines tends to decrease while the size of the corresponding patterned space or hole tends to increase, a particular problem for minimum dimension openings. Additionally, ArF resist patterns may exhibit undesirably roughness (LER) as a result of decreased homogeneity of the ArF resist during polymerization.

Recently, E-beam curing has been proposed as a possible remedy for the CD slimming and LER problems experienced with ArF resists. In E-beam curing, the ArF resist pattern is hardened before measurement to reduce CD shrinkage during SEM measurement, typically by exposing the developed ArF resist pattern to a number of E-beam doses using a focus expose matrix (FEM) to increase the degree of crosslinking and rigidify the resist pattern before significant decomposition or mass loss occurs. E-beam curing, however, increases the complexity and length of the manufacturing process and the additional handling increases the likelihood of particulate contamination.

SUMMARY OF THE INVENTION

Exemplary embodiments of the invention provide methods for forming fine patterns, particularly contact holes, on semiconductor devices by forming an ArF resist pattern and then reducing the size of pattern openings by exposing the resist pattern to radiation from an VUV (vacuum ultraviolet) excimer laser having a wavelength of not more than 172 nm or E-beam radiation during thermal treatment. VUV refers to a region of the electromagnetic spectrum between the longest-wavelength X-rays and far ultraviolet covering a wavelength range of approximately 100 to 200 nm. Light energy in this range of the spectrum is attenuated by absorption in $O_2$, requiring most VUV processes to be carried out in a vacuum or under $N_2$ purging to reduce the atmospheric $O_2$ content, hence the name. In particular, the exemplary embodiments of the invention provide methods for shrinking the size of contact hole by exposing an ArF resist pattern during thermal treatment at a temperature between about 30° C. and about 180° C. to VUV light energy or E-beam energy to cause the resist pattern to flow in a controllable and reproducible manner. This patterning method thereby provides the ability to reduce the patterned opening sizing in fine resist patterns while improving CD stability and reproducibility to enhance the process yield and the reliability of the resulting semiconductor devices.

BRIEF DESCRIPTION OF THE DRAWINGS

The advantages and scope of the present invention will be further disclosed through reference to the following detailed description and examples of exemplary embodiments when considered in conjunction with the accompanying drawings wherein.

DESCRIPTION OF EXEMPLARY EMBODIMENTS

Figure 1:
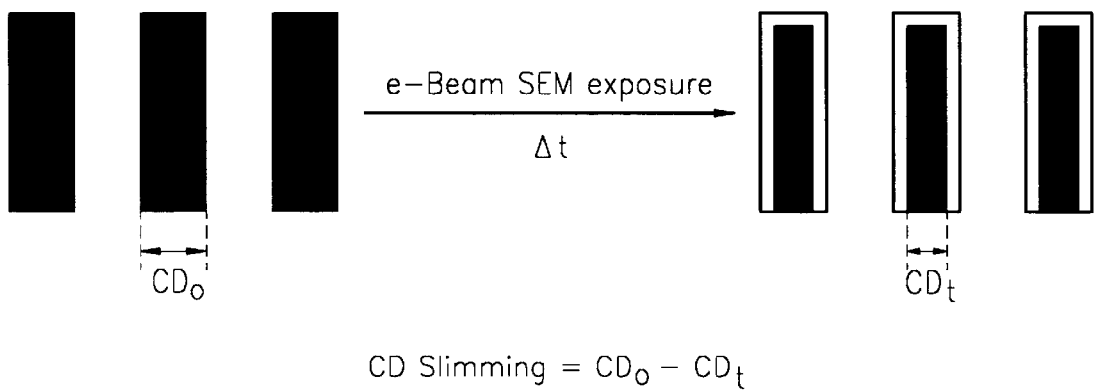
FIG. 1 illustrates the CD slimming effects induced by SEM measurement using conventional patterning processes.
Figure 2:
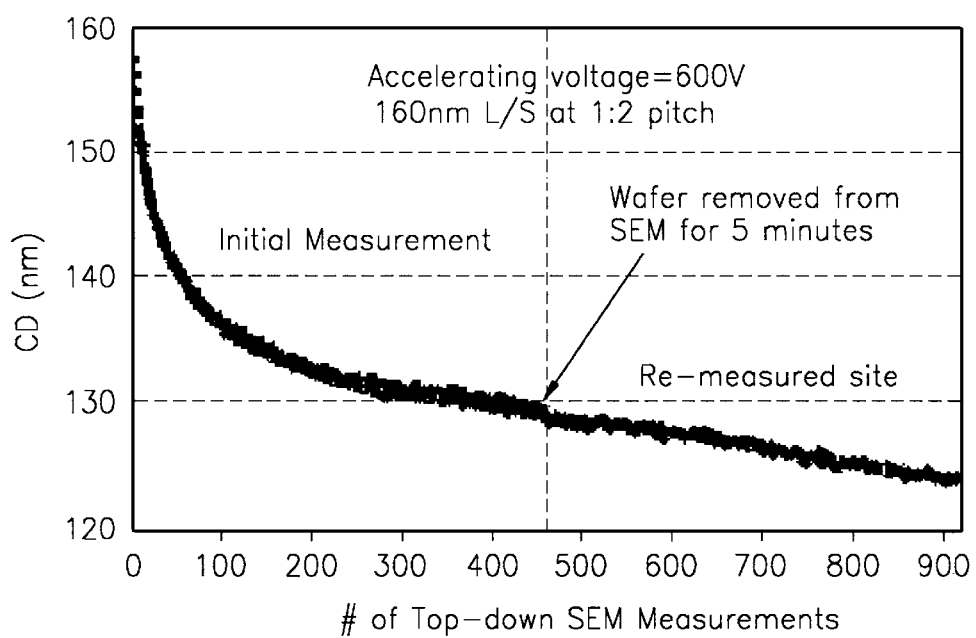
FIG. 2 is a graph illustrating the CD slimming observed during repeated SEM measurements on a resist pattern formed using conventional patterning processes.

The present invention relates to a method of reducing the size of pattern openings, particularly contact and via holes, and enhancing etch resistance by using VUV treatment using light energy having a central wavelength of 172 nm or less or E-beam energy. Although PHP (polyhydroxy phenol) polymers are useful in KrF photoresist compositions, they are generally unsuited for use in ArF photoresist compositions as a result of their lower transmittance (high absorption) of light energy from ArF excimer lasers having a central wavelength of about 193 nm. As a result, acrylate polymers, COMA (cycloolefin/maleic anhydride) polymers, polynorbornene polymers or VEMA (vinylether/maleic anhydride) polymers are better suited for use in ArF photoresist compositions because of their improved transmittance of light energy of about 193 nm and resolution. Such ArF photoresist compositions, however, present a complication in that their glass transition temperature $T_g$ is elevated relative to the KrF photoresist materials, typically 200° C. or more. This elevated $T_g$ makes it difficult to flow an ArF photoresist pattern without exceeding the decomposition temperature $T_d$ and subjecting the semiconductor wafer to higher temperatures.

In order to address the complications associated with ArF photoresists, the exemplary embodiments of the invention provide methods for permitting the photoresist pattern to flow at lower temperatures by using VUV excimer lasers or E-beams to reduce the $T_g$ temporarily to a lower $T_{g_{eff}}$. Many types of polymer backbones are utilized in ArF photoresist compositions, but most of these polymer backbones include carboxylic acid which is soluble in an alkaline solution. Carboxylic acids are particularly useful functional groups for further chemical attachment or modification beyond the first layer, such as attachment of biomolecules to functionalized surfaces. Carboxylic acid blocked by an alicyclic group like adamantane is generally insoluble in an alkaline solution because the alicyclic group acts as an acid labile protecting group. The acid labile functionalized units are generally insoluble in aqueous solutions and thus act to retard development in the unexposed regions of an exposed photoresist layer to provide more vertical profiles in the resulting photoresist pattern. Photoacid generators produce an acid when they are exposed to activating radiation during an exposure process. The acid labile protecting group is unprotected by the acid generated after light exposure and post expose bake process.

Specifically, during a post-exposure bake (PEB) process following the irradiation of the photoresist, the acid formed in the exposed portions of the photoresist layer catalyzes a series of chain-breaking and/or other chemical reactions in the photoresist polymer in the photoresist. These reactions produce structural changes in the polymer and render the exposed regions of the photoresist layer more soluble in an alkaline solution than the photoresist in the unexposed regions. This difference in solubility in an alkaline solution between the exposed region and the unexposed region of the resist film allows the photoresist pattern to be developed from the exposed photoresist layer by removing the exposed portions of the photoresist layer. The minimum feature sizes that may be formed in an ArF photoresist remain, however, limited by the wavelength of the exposing light energy and may be larger than desired, requiring some post-development processing to reduce the size of the openings in the photoresist pattern.

Exemplary methods of the invention provide a means of reducing the size of the openings in an ArF photoresist pattern by heating the resist pattern to a process temperature below both $T_g$ and $T_d$ while exposing the resist pattern to VUV light energy or E-beam energy. The VUV light energy or E-beam energy produces a temporary reduction in the glass transition temperature of the resist pattern, thereby allowing the resist pattern to flow and reduce the sizes of the pattern openings. When applying VUV energy, the concentration of oxygen in the process chamber may be lowered to reduce the absorption of the VUV energy by the atmosphere within the chamber. During the VUV treatment, VUV light energy having a wavelength shorter than the wavelength of the exposing light source may be used to input energy into the photoresist pattern and allow it to flow and reduce the size of the openings while reducing any additional exposure effects.

Short wavelength laser light of 172 nm or less tends to be absorbed by carboxylic groups and tends to generate radical formations in the polymer chain and the acid labile protection group by unprotecting the carboxylic group. It is believed that carbon dioxide is generated when acid labile protection group is unprotected and will tend to evaporate from the resist pattern during this treatment. Thus, a high free volume is created during the evaporation of carbon dioxide and the unprotected acid labile protecting group such as adamantane temporarily forms smaller molecules within the resist film. Both the increase in the free volume and the presence of the smaller molecules tend to increase the flowability of photoresist pattern by acting as thermal-plasticizers. The term plasticizer refers to small molecules that, when added to a polymer tend to lower its $T_g$. Accordingly, the $T_g$ of the photoresist polymer drops rapidly and allows the photoresist film to flow at a $T_{g_{eff}}$ below the nominal $T_g$ during the thermal treatment. However, during the thermal treatment the photoresist pattern is also subjected to crosslinking reactions resulting from generated radicals being bonded immediately to one another. As the crosslinking reactions proceed in the photoresist film, the final $T_{g_{final}}$ of the photoresist polymer increases above its original $T_g$ and the density and hardness of the remaining photoresist pattern are increased.

As a matter of course, the properties of the photoresist pattern change during the post development treatment as a result of the formation of the plasticizers and the crosslinking reactions among the polymers. However, these property changes do not tend to reduce, and may in fact increase, the effectiveness of the photoresist pattern as an etch mask. In order to stay at a temperature below $T_d$ and avoid unnecessary heating, the VUV treatment may be conducted while the patterned wafer is maintained at a temperature between about 30° C. to about 180° C., and particularly between about 40° C. to 80° C. The treatment temperature may be controlled by using a hot plate, a halogen lamp or any other suitable heating device.

Figure 3A:
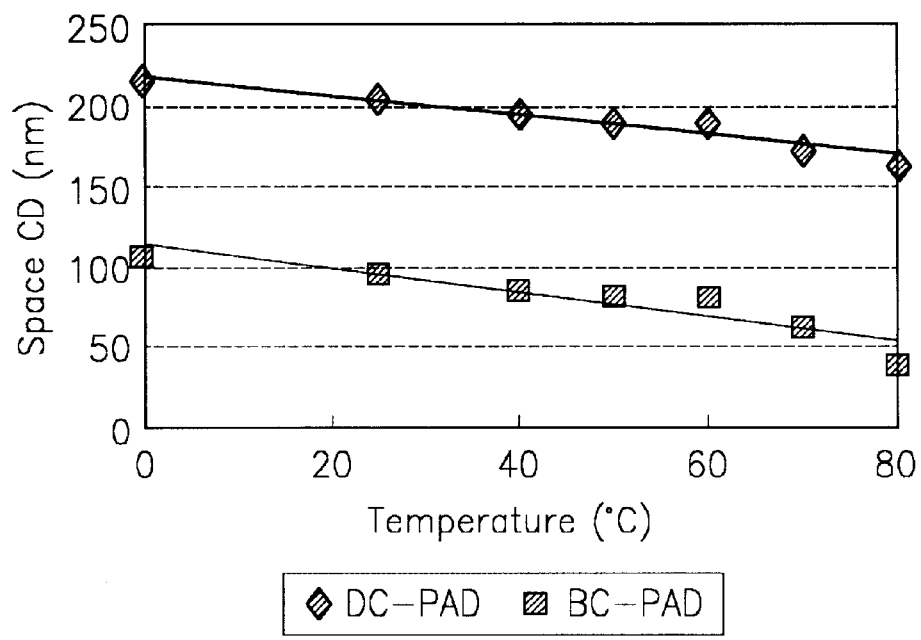
FIG. 3 illustrates the change in CD measurement and the flow length for a photoresist pattern as a function of temperature according to exemplary embodiments of the invention.
Figure 3B:
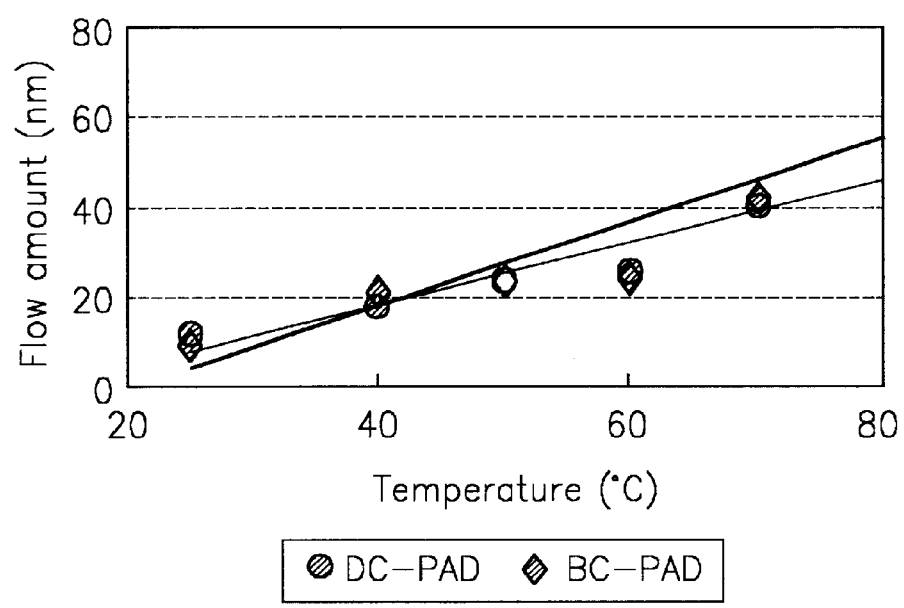
Figure 4:
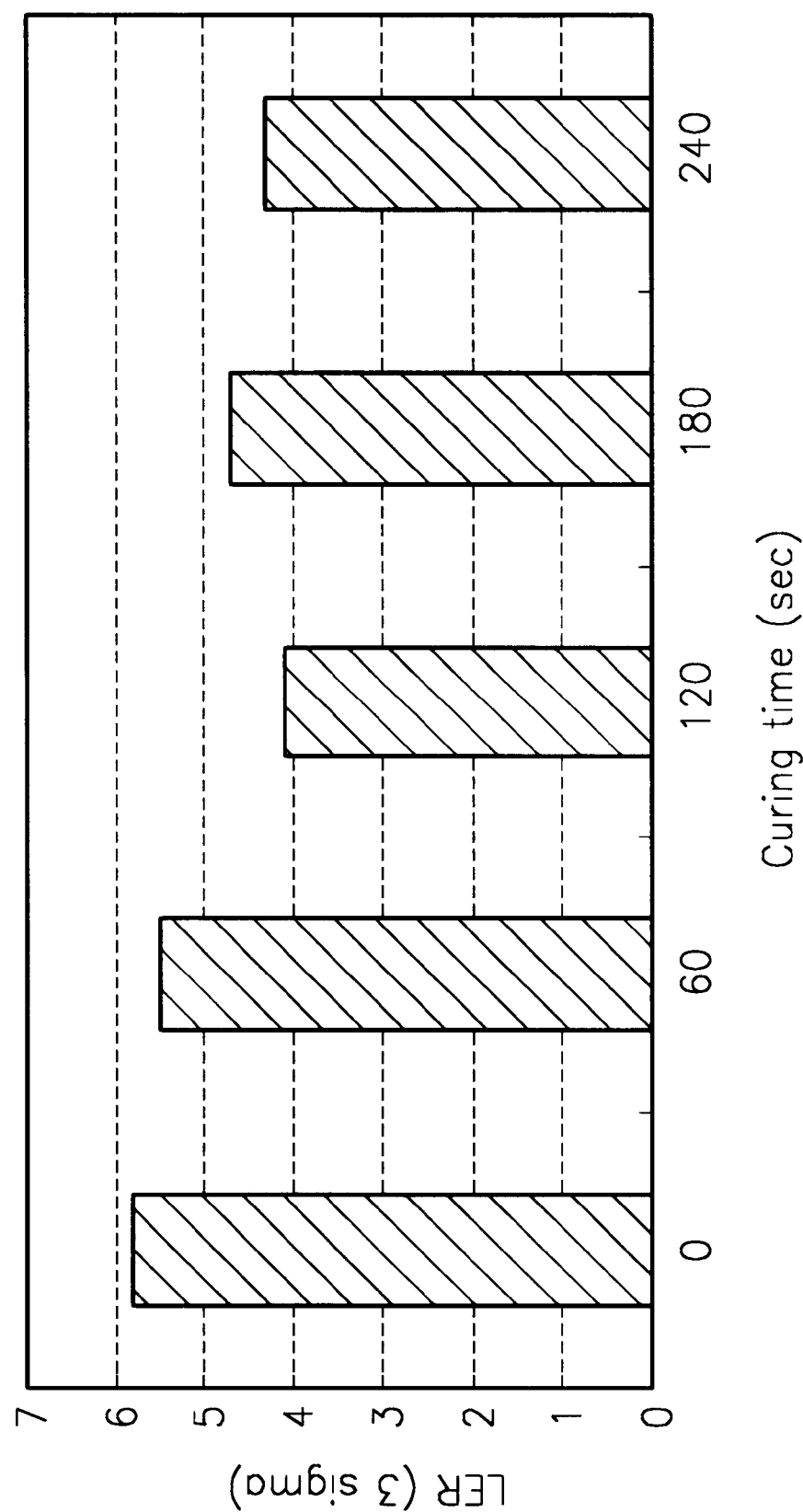
FIG. 4 illustrates the LER of a photoresist pattern as a function of the length of the VUV treatment according to exemplary embodiments of the invention.
Figure 5:
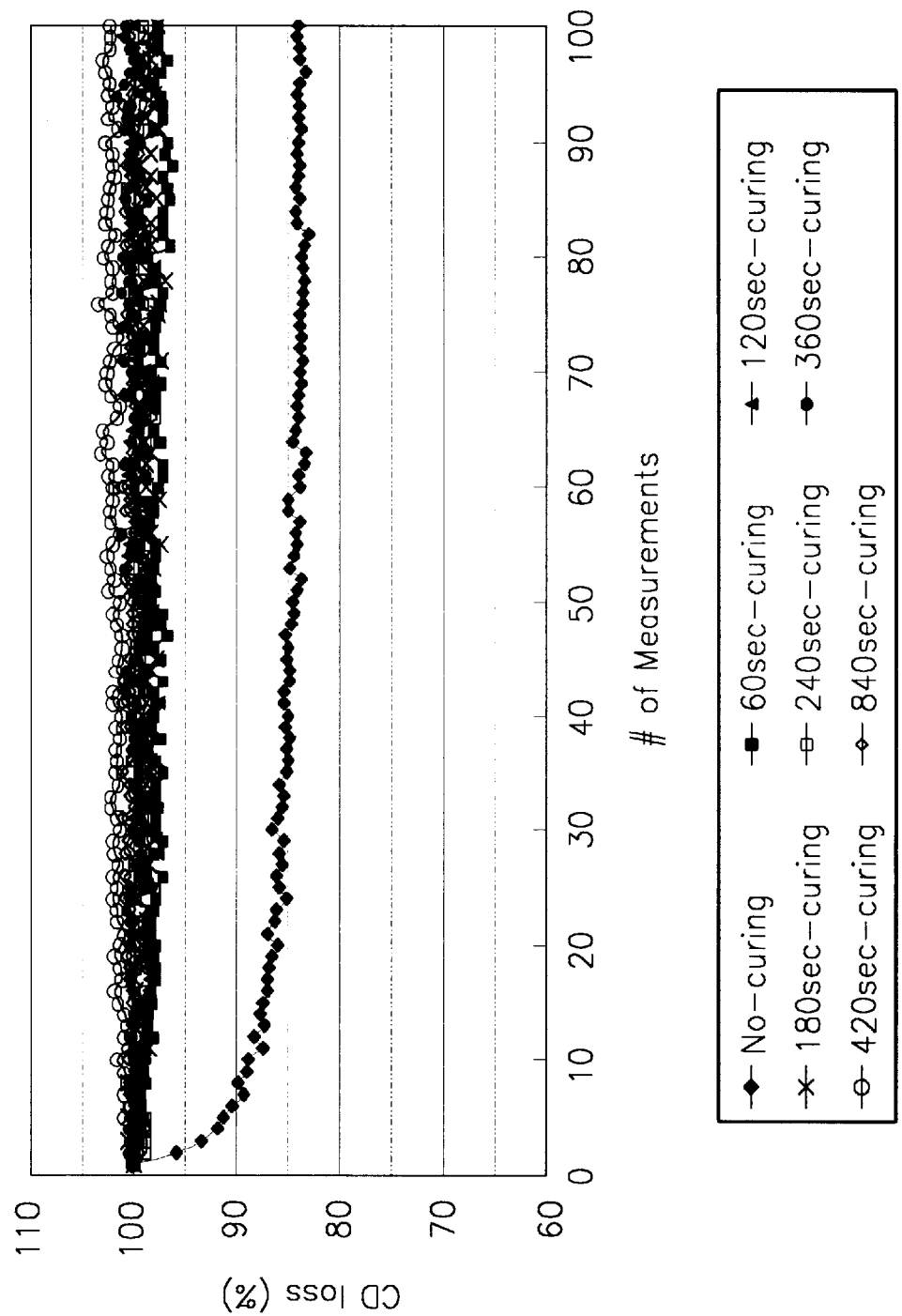
FIG. 5 illustrates the resistance to CD slimming as a function of the VUV treatment during repeated SEM measurements according to exemplary embodiments of the invention and a conventional patterning process.
Figure 6:
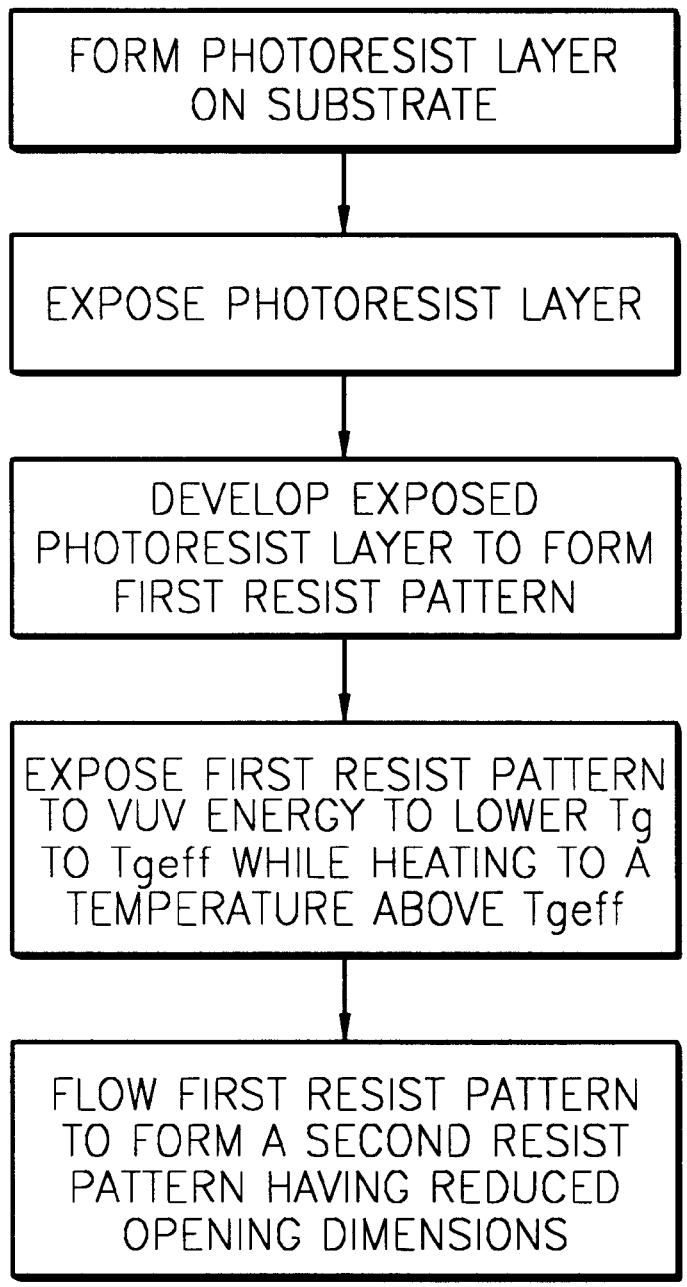
FIG. 6 provides a process flow chart for a method according to an exemplary embodiment of the invention.

The flow rate of the photoresist pattern tends to increase in direct proportion to temperature as illustrated in FIG. 3. Even though the thickness of the photoresist film is slightly diminished after the photoresist pattern flows, the dry etch resistance of the photoresist film increases because the oxygen content, which is known to degrade dry etch resistance has been reduced and the photoresist film has been hardened and densified. A 172 nm VUV treatment according to an exemplary embodiment of the present invention provides a method for forming fine photoresist pattern having improved dry etch resistance without CD slimming or LER. FIGS. 4 and 5 illustrate the improvement in both the resistance to CD slimming and decreased LER for ArF photoresist patterns after VUV treatment. Results simiilar to those obtained through VUV treatment of ArF photoresist may be achieved with E-beam treatment.

The method of forming fine photoresist patterns according to the invention is further disclosed through a series of examples illustrating exemplary embodiments of the present invention and the results achieved with these various embodiments. The exemplary embodiments encompass a range of ArF photoresists, exposures, bake processes and post-development treatments. The specifics regarding each of the exemplary embodiments are detailed in Tables 1–5 below.

In each example, a commercial ArF photoresist composition was coated onto the surface of a substrate to form a photoresist layer. Each photoresist layer was then dried with a brief bake to form a photoresist film of between about 2600 to about 2900 Å. The photoresist film was then exposed with a mask pattern using an ArF excimer laser as the exposing light source (NA=0.75, σ=0.7) using an exposure dose of between about 25 and about 40 mJ/cm$^2$ to form an exposed photoresist film.

The exposed photoresist film was then subjected to a heat treatment (baking) whereby an acid is generated in the exposed portions of the resist film. The acid functions as a catalyst to promote a reaction that decomposes portions of the photoresist film polymer into compounds having enhanced solubility, particularly in alkaline solutions. This heat treatment is generally performed between about 50° C., to decrease the time necessary to obtain a sufficient degree of reaction within the exposed portions of the photoresist, and about 180° C., to reduce or avoid decomposition in both the exposed and unexposed portions of the photoresist film. In the absence of heat treatment, holding the exposed substrate at room temperature for an extended period of time may eventually achieve a sufficient degree of reaction within the exposed portions of the photoresist to allow the pattern to be developed.

Once a sufficient degree of reaction within the exposed photoresist film has been reached, the photoresist film may be developed by treatment with an alkaline solution to remove the exposed and now decomposed portions of the photoresist film to form a photoresist pattern. The alkaline solution may be applied using a variety of methods, including, for example the dipping, spraying or puddle methods, for a range of time periods, for example 30 to 120 seconds. In any event, the particular parameters used to develop the exposed and reacted photoresist film should be sufficient to remove substantially all of the photoresist and decomposition compounds from the exposed regions of the photoresist film while leaving the unexposed portions of the photoresist film largely intact. For the specific photoresists and treatment methods reflected in Tables 1–5 below, adequate development of the photoresist pattern was achieved using an alkaline developer solution applied to the substrate using the puddle method with a develop duration of about 60 seconds.

Although neutral solutions may be used, alkaline solutions improve the development process. An aqueous solution of between about 0.5 wt % and about 2.5 wt % tetramethylammonium hydroxide may be used as the developer solution. In addition to the hydroxide, the developer solution may also include minor amounts of one or more alcohols and/or surfactants. An alkaline solution of not more than about 2.38 wt % tetramethylammonium hydroxide (TMAH) was found to provide sufficient differentiation in the dissolution rate of the exposed and unexposed portions of the photoresist films used in the Examples to provide adequate pattern development. The exposed portions of the substrate and the development photoresist film (resist pattern) were then typically rinsed with water to remove the developer solution and dried. The size of contact holes formed in the photoresist pattern were then measured to obtain the reported diameter values of between about 100 nm and about 220 nm.

The patterned wafer was transferred to a hot plate chuck for VUV exposure and heating using a conventional wafer transfer system. After the wafer was positioned on the hot plate chuck, the VUV chamber was purged with $N_2$ to reduce and maintain the oxygen concentration at less than 20 ppm. During this $N_2$ purge, the wafer was heated and maintained at a temperature between about 30° C. and about 50° C. using the hot plate and/or a halogen lamp assembly. Once the wafer had reached the process temperature and the $O_2$ concentration was sufficiently low, the photoresist pattern was exposed to VUV radiation using a $Xe_2$ light source at an energy between about 0.5 $J/cm^2$ and 30 $J/cm^2$ to cause the pattern to flow and reduce the size of the contact openings. The reduced contact openings were then again measured to determine the extent to which their size had been decreased by the VUV treatment.

Although a $Xe_2$ light source was used in processing the Examples, it is anticipated that treatment using other VUV light sources, particularly $Ar_2$ and $Kr_2$ light sources, or an E-beam radiation source would also tend to reduce the size of the contact holes formed in an ArF resist. The benefits of the present invention may be enhanced by selecting a VUV light source having a wavelength shorter than the wavelength used for exposing the photoresist film. With respect to ArF photoresist compositions designed to be exposed with an ArF excimer laser (about 193 nm) for example, VUV treatment with a $Xe_2$ light source (about 172 nm) yielded satisfactory results. And similarly, although the Examples were processed using an $N_2$ purge to reduce the oxygen ($O_2$) concentration within the VUV chamber to below 20 ppm, other gases or gas mixtures, vacuum pumps or a combination may be used to achieve a similar reduction in the oxygen concentration sufficient for VUV operation.

EXAMPLES 1–4

TABLE 1

| Example | 1 | 2 | 3 | 4 |
|---|---|---|---|---|
| Resist Type | EPIC-V4[1] | AR414J[2] | AR414J | SAIL-X66[3] |
| Resist Thickness (Å) | 2700 | 2700 | 2700 | 2700 |
| Resist Application | spin coat | spin coat | spin coat | spin coat |
| Bake Temp (° C.) | 120 | 130 | 130 | 130 |
| Bake Time (sec) | 90 | 90 | 90 | 60 |
| Exposure NA | 0.75 | 0.75 | 0.75 | 0.75 |
| Exposure σ | 0.7 | 0.7 | 0.7 | 0.7 |
| Exposure dose (mJ/cm²) | 30 | 26 | 26 | 36 |
| PEB[4] Temp (° C.) | 120 | 130 | 130 | 115 |
| PEB Time (sec) | 60 | 90 | 90 | 60 |
| Developer Type | TMAH | TMAH | TMAH | TMAH |

TABLE 1-continued

| Example | 1 | 2 | 3 | 4 |
|---|---|---|---|---|
| TMAH Content (wt %) | ≦2.38 | ≦2.38 | ≦2.38 | ≦2.38 |
| Developer Application | puddle | puddle | puddle | puddle |
| Developer Time (sec) | ≈60 | ≈60 | ≈60 | ≈60 |
| Initial Contact Size (nm) | 160 | 170 | 160 | 150 |
| Heat Treatment Temp (° C.) | 30 | 30 | 30 | 30 |
| Heat Treatment Time (sec) | >60 | >60 | >60 | >60 |
| $O_2$ Reduction Method | $N_2$ purge | $N_2$ purge | $N_2$ purge | $N_2$ purge |
| $O_2$ Concentration (ppm) | <20 | <20 | <20 | <20 |
| VUV source | $Xe_2$ | $Xe_2$ | $Xe_2$ | $Xe_2$ |
| VUV energy (J/cm²) | 0.6 | 1.0 | 10 | 10 |
| Final Contact Size (nm) | 150 | 150 | 140 | 130 |
| Contact Size Decrease (nm) | 10 | 20 | 20 | 20 |

[1] An ArF photoresist manufactured by Shipley Ltd.
[2] An ArF photoresist manufactured by the JSR Corporation.
[3] An ArF photoresist manufactured by Shinetsu Chemical Co., Ltd.
[4] Post Exposure Bake

EXAMPLES 5–8

TABLE 2

| Example | 5 | 6 | 7 | 8 |
|---|---|---|---|---|
| Resist Type | TArF[5] | DHA-S140[6] | AZ-T9269[7] | AZ-T444[8] |
| Resist Thickness (Å) | 2600 | 2800 | 2900 | 2900 |
| Resist Application | spin coat | spin coat | spin coat | spin coat |
| Bake Temp (° C.) | 115 | 130 | 130 | 110 |
| Bake Time (sec) | 90 | 90 | 60 | 90 |
| Exposure NA | 0.75 | 0.75 | 0.75 | 0.75 |
| Exposure σ | 0.7 | 0.7 | 0.7 | 0.7 |
| Exposure dose (mJ/cm²) | 28 | 33 | 40 | 40 |
| PEB Temp (° C.) | 115 | 130 | 130 | 130 |
| PEB Time (sec) | 60 | 90 | 60 | 90 |
| Developer Type | TMAH | TMAH | TMAH | TMAH |
| TMAH Content (wt %) | ≦2.38 | ≦2.38 | ≦2.38 | ≦2.38 |
| Developer Application | puddle | puddle | puddle | puddle |
| Developer Time (sec) | ≈60 | ≈60 | ≈60 | ≈60 |
| Initial Contact Size (nm) | 150 | 160 | 150 | 160 |
| Heat Treatment Temp (° C.) | 30 | 30 | 30 | 30 |
| Heat Treatment Time (sec) | >60 | >60 | >60 | >60 |
| $O_2$ Reduction Method | $N_2$ purge | $N_2$ purge | $N_2$ purge | $N_2$ purge |
| $O_2$ Concentration (ppm) | <20 | <20 | <20 | <20 |
| VUV source | $Xe_2$ | $Xe_2$ | $Xe_2$ | $Xe_2$ |
| VUV energy (J/cm²) | 20 | 20 | 30 | 30 |
| Final Contact Size (nm) | 130 | 140 | 130 | 150 |
| Contact Size Decrease (nm) | 20 | 20 | 20 | 10 |

[5] An ArF photoresist manufactured by Tok Bearing Co., Ltd.
[6] An ArF photoresist manufactured by Dongjin Semichem Co., Ltd.
[7] An ArF photoresist manufactured by Clariant Finance (BVI) Ltd.
[8] An ArF photoresist manufactured by Clariant Finance (BVI) Ltd.

EXAMPLES 9–12

TABLE 3

| Example | 9 | 10 | 11 | 12 |
|---|---|---|---|---|
| Resist Type | PAR-811A25[9] | EPIC-V4 | EPIC-V4 | EPIC-V4 |
| Resist Thickness (Å) | 2900 | 2700 | 2700 | 2700 |
| Resist Application | spin coat | spin coat | spin coat | spin coat |
| Bake Temp (° C.) | 115 | 120 | 120 | 120 |
| Bake Time (sec) | 60 | 90 | 90 | 90 |
| Exposure NA | 0.75 | 0.75 | 0.75 | 0.75 |

TABLE 3-continued

| Example | 9 | 10 | 11 | 12 |
|---|---|---|---|---|
| Exposure σ | 0.7 | 0.7 | 0.7 | 0.7 |
| Exposure dose (mJ/cm²) | 45 | 30 | 30 | 30 |
| PEB Temp (° C.) | 115 | 120 | 120 | 120 |
| PEB Time (sec) | 60 | 60 | 60 | 60 |
| Developer Type | TMAH | TMAH | TMAH | TMAH |
| TMAH Content (wt %) | ≦2.38 | ≦2.38 | ≦2.38 | ≦2.38 |
| Developer Application | puddle | puddle | puddle | puddle |
| Developer Time (sec) | ≈60 | ≈60 | ≈60 | ≈60 |
| Initial Contact Size (nm) | 170 | 210 | 100 | 210 |
| Heat Treatment Temp (° C.) | 30 | 40 | 40 | 50 |
| Heat Treatment Time (sec) | >60 | >60 | >60 | >60 |
| O₂ Reduction Method | N₂ purge | N₂ purge | N₂ purge | N₂ purge |
| O₂ Concentration (ppm) | <20 | <20 | <20 | <20 |
| VUV source | Xe₂ | Xe₂ | Xe₂ | Xe₂ |
| VUV energy (J/cm²) | 3.5 | 0.6 | 0.6 | 0.6 |
| Final Contact Size (nm) | 150 | 205 | 85 | 190 |
| Contact Size Decrease (nm) | 20 | 5 | 15 | 20 |

[9]An ArF photoresist manufactured by Sumitomo Wiring Systems Ltd.

EXAMPLES 13–16

TABLE 4

| Example | 13 | 14 | 15 | 16 |
|---|---|---|---|---|
| Resist Type | EPIC-V4 | EPIC-V4 | EPIC-V4 | EPIC-V4 |
| Resist Thickness (Å) | 2700 | 2700 | 2700 | 2700 |
| Resist Application | spin coat | spin coat | spin coat | spin coat |
| Bake Temp (° C.) | 120 | 120 | 120 | 120 |
| Bake Time (sec) | 90 | 90 | 90 | 90 |
| Exposure NA | 0.75 | 0.75 | 0.75 | 0.75 |
| Exposure σ | 0.7 | 0.7 | 0.7 | 0.7 |
| Exposure dose (mJ/cm²) | 30 | 30 | 30 | 30 |
| PEB Temp (° C.) | 120 | 120 | 120 | 120 |
| PEB Time (sec) | 60 | 60 | 60 | 60 |
| Developer Type | TMAH | TMAH | TMAH | TMAH |
| TMAH Content (wt %) | ≦2.38 | ≦2.38 | ≦2.38 | ≦2.38 |
| Developer Application | puddle | puddle | puddle | puddle |
| Developer Time (sec) | ≈60 | ≈60 | ≈60 | ≈60 |
| Initial Contact Size (nm) | 105 | 106 | 215 | 105 |
| Heat Treatment Temp (° C.) | 50 | 60 | 70 | 70 |
| Heat Treatment Time (sec) | >60 | >60 | >60 | >60 |
| O₂ Reduction Method | N₂ purge | N₂ purge | N₂ purge | N₂ purge |
| O₂ Concentration (ppm) | <20 | <20 | <20 | <20 |
| VUV source | Xe₂ | Xe₂ | Xe₂ | Xe₂ |
| VUV energy (J/cm²) | 0.6 | 0.6 | 0.6 | 0.6 |
| Final Contact Size (nm) | 83 | 82 | 175 | 65 |
| Contact Size Decrease (nm) | 22 | 24 | 40 | 40 |

EXAMPLES 17–18

TABLE 5

| Example | 17 | 18 |
|---|---|---|
| Resist Type | EPIC-V4 | EPIC-V4 |
| Resist Thickness (Å) | 2700 | 2700 |
| Resist Application | spin coat | spin coat |
| Bake Temp (° C.) | 120 | 120 |
| Bake Time (sec) | 90 | 90 |
| Exposure NA | 0.75 | 0.75 |
| Exposure σ | 0.7 | 0.7 |
| Exposure dose (mJ/cm²) | 30 | 30 |
| PEB Temp (° C.) | 120 | 120 |
| PEB Time (sec) | 60 | 60 |
| Developer Type | TMAH | TMAH |
| TMAH Content (wt %) | ≦2.38 | ≦2.38 |
| Developer Application | puddle | puddle |
| Developer Time (sec) | ≈60 | ≈60 |
| Initial Contact Size (nm) | 105 | 105 |
| Heat Treatment Temp (° C.) | 70 | 70 |
| Heat Treatment Time (sec) | >60 | >60 |
| O₂ Reduction Method | N₂ purge | N₂ purge |
| O₂ Concentration (ppm) | <20 | <20 |
| VUV source | Xe₂ | Xe₂ |
| VUV energy (J/cm²) | 0.6 | 0.6 |
| Final Contact Size (nm) | 65 | 65 |
| Contact Size Decrease (nm) | 40 | 40 |

Although certain exemplary embodiments of the present invention have been described, it is understood that the present invention should not be limited to these embodiments but various changes and modifications can be made by one skilled in the art within the spirit and scope of the present invention as hereinafter claimed.

What is claimed is:

1. A method of forming a fine pattern on a substrate comprising:

forming a photoresist layer on the substrate, the photoresist being adapted for exposure by UV radiation of wavelength $W_1$ and having a glass transition temperature $T_g$ and a decomposition temperature $T_d$;

exposing portions of the photoresist layer with the UV radiation to form an exposed photoresist layer with exposed portions and unexposed portions;

developing the exposed photoresist layer to form a first photoresist pattern, the first photoresist pattern having an opening having a critical dimension $d_1$; and exposing the first photoresist pattern to VUV radiation of wavelength $W_2$ thereby temporarily producing an effective glass transition temperature $T_{g_{eff}}$ wherein $T_{g_{eff}} < T_g$ while simultaneously heating the first photoresist pattern to a temperature at or above the $T_{g_{eff}}$ to produce a second photoresist pattern in which the opening has a critical dimension $d_2$, wherein $d_2 < d_1$.

2. A method of forming a fine pattern on a substrate according to claim 1, further comprising:

baking the exposed photoresist layer at a temperature below $T_d$ before developing the exposing photoresist layer.

3. A method of forming a fine pattern on a substrate according to claim 1, wherein developing the exposed photoresist layer further comprises:

wetting the exposed photoresist layer with an alkaline solution to dissolve the exposed portions of the exposed photoresist layer; and removing the alkaline solution and the dissolved portion of the exposed photoresist layer from the substrate.

4. A method of forming a fine pattern on a substrate according to claim 3, wherein the alkaline solution is an aqueous solution of tetramethylammonium hydroxide.

5. A method of forming a fine pattern on a substrate according to claim 4, wherein the alkaline solution comprises between 0.1 and 10 weight percent tetramethylammonium hydroxide (TMAH).

6. A method of forming a fine pattern on a substrate according to claim 5, wherein the aqueous solution also includes at least one additive selected from a group consisting of alcohols and surfactants.

7. A method of forming a fine pattern on a substrate according to claim 6, wherein
a total quantity of all additives is less than 5 weight percent of the aqueous solution and
tetramethylammonium hydroxide is present in the solution in an amount between about 2 and about 2.5 weight percent.

8. A method of forming a fine pattern on a substrate according to claim 2, wherein:
the photoresist layer is a photoresist selected from a group consisting of KrF photoresists, ArF photoresists and $F_2$ photoresists;
the UV radiation wavelength $W_1$ is selected from the group consisting of 248 nm, 193 nm and 157 nm; and
the VUV radiation wavelength $W_2$ is selected from the group consisting of 172 nm, 146 nm and 126 nm.

9. A method of forming a fine pattern on a substrate according to claim 8, wherein:
$T_g - T_{g_{eff}} \geq 20°$ C.; and
$W_1 > W_2$.

10. A method of forming a fine pattern on a substrate according to claim 9, wherein:
the VUV radiation is applied at a level of between 0.1 and 100 $J/cm^2$; and
$T_{g_{eff}} \leq 100°$ C.

11. A method of forming a fine pattern on a substrate according to claim 2, wherein:
$T_d < T_g$.

12. A method of forming a fine pattern on a substrate comprising:
forming a photoresist layer on the substrate, the photoresist being adapted for exposure by UV radiation having a wavelength of less than 250 nm, the photoresist also having a decomposition temperature $T_d$ and a glass transition temperature $T_g$;
exposing portions of the photoresist layer with UV radiation having a wavelength of less than 250 nm to form an exposed photoresist layer having exposed portions and unexposed portions;
developing the exposed photoresist layer to form a first photoresist pattern, the first photoresist pattern having an opening having a critical dimension $d_1$; and
exposing the first photoresist pattern to E-beam radiation, the E-beam radiation temporarily producing an effective glass transition temperature $T_{g_{eff}}$ wherein $T_{g_{eff}} < T_g$ while simultaneously heating the first photoresist pattern to a temperature at or above the $T_{g_{eff}}$ to produce a second photoresist pattern in which the opening has a critical dimension $d_2$, wherein $d_2 < d_1$.

13. A method of forming a fine pattern on a substrate according to claim 12, further comprising:
baking the exposed photoresist layer at a temperature below $T_d$ before developing the exposed photoresist layer.

14. A method of forming a fine pattern on a substrate according to claim 12, wherein developing the exposed photoresist layer further comprises:
wetting the exposed photoresist layer with an alkaline solution to dissolve exposed portions of the exposed photoresist layer; and
removing the alkaline solution and the dissolved portion of the exposed photoresist layer from the substrate.

15. A method of forming a fine pattern on a substrate according to claim 13, wherein the alkaline solution comprises an aqueous solution of less than 10 weight percent tetramethylammonium hydroxide.

16. A method of forming a fine pattern on a substrate according to claim 15, wherein the aqueous solution further comprises at least one additive selected from a group consisting of alcohols, viscosity modifiers and surfactants.

17. A method of forming a fine pattern on a substrate according to claim 13, wherein:
the photoresist layer comprises a photoresist selected from a group consisting of KrF photoresists, ArF photoresists and $F_2$ photoresists; and
the UV radiation has a wavelength selected from the group consisting of 248 nm, 193 nm and 157 nm.

18. A method of forming a fine pattern on a substrate according to claim 13, wherein:
$T_g - T_{g_{eff}} \geq 20°$ C.

19. A method of forming a fine pattern on a substrate according to claim 13, wherein:
the E-beam radiation is applied at a level of between 0.1 and 100 $J/cm^2$; and
$T_{g_{eff}} \leq 100°$ C.

20. A method of forming a fine pattern on a substrate according to claim 13, wherein:
$T_d < T_g$.

21. A method of forming a fine pattern on a substrate according to claim 12, wherein:
the first photoresist pattern is simultaneously exposed to E-beam radiation and VUV radiation having a wavelength not greater than about 172 nm, the E-beam radiation and the VUV radiation cooperating to temporarily produce an effective glass transition temperature $T_{g_{eff}}$ wherein $T_{g_{eff}} < T_g$.

* * * * *